United States Patent
Yu et al.

(10) Patent No.: US 9,704,545 B2
(45) Date of Patent: Jul. 11, 2017

(54) SEMICONDUCTOR MEMORY DEVICE AND A METHOD OF OPERATING A BIT LINE SENSE AMPLIFIER OF THE SAME

(71) Applicant: SAMSUNG ELECTRONICS CO., LTD., Suwon-si, Gyeonggi-Do (KR)

(72) Inventors: Seong-Heon Yu, Suwon-si (KR); Jonghyun Choi, Suwon-si (KR); Dongwoo Sohn, Hwaseong-si (KR); Ki-Seok Oh, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/175,550

(22) Filed: Jun. 7, 2016

(65) Prior Publication Data
US 2017/0032831 A1    Feb. 2, 2017

(30) Foreign Application Priority Data
Jul. 31, 2015  (KR) ......................... 10-2015-0108897

(51) Int. Cl.
*G11C 7/12* (2006.01)
*G11C 7/06* (2006.01)
*G11C 5/14* (2006.01)

(52) U.S. Cl.
CPC ................ *G11C 7/12* (2013.01); *G11C 5/141* (2013.01); *G11C 7/062* (2013.01)

(58) Field of Classification Search
CPC .................................. G11C 7/12; G11C 5/141
USPC ........................................................ 365/203
See application file for complete search history.

(56) References Cited

U.S. PATENT DOCUMENTS

| | | | |
|---|---|---|---|
| 5,905,685 A * | 5/1999 | Nakamura | G11C 11/4074 365/205 |
| 6,420,908 B2 | 7/2002 | Mueller et al. | |
| 6,906,967 B2 | 6/2005 | Choi et al. | |
| 7,203,124 B2 | 4/2007 | Kim et al. | |
| 7,911,863 B2 | 3/2011 | Takahashi | |
| 8,238,141 B2 * | 8/2012 | Katoch | G11C 11/4091 365/149 |
| 2009/0080234 A1 * | 3/2009 | Takahashi | G11C 7/08 365/149 |
| 2009/0231939 A1 * | 9/2009 | Hsu | G11C 7/08 365/210.12 |

FOREIGN PATENT DOCUMENTS

KR    100610005    8/2006

* cited by examiner

*Primary Examiner* — Hoai V Ho
*Assistant Examiner* — Muna A Techane
(74) *Attorney, Agent, or Firm* — F. Chau & Associates, LLC (57) ABSTRACT

A semiconductor memory device includes a plurality of memory cells, a plurality of word lines and a plurality of bit lines, wherein each memory cell is coupled to a respective word line and bit line. The semiconductor memory device includes a plurality of sense amplifiers, wherein each sense amplifier is coupled to two bit lines. The semiconductor memory device is configured to receive a first positive supply voltage, a second positive supply voltage, and a negative supply voltage, and determine a low level of an amplified voltage based on the negative supply voltage in an operation of amplifying data in a memory cell.

17 Claims, 10 Drawing Sheets

SEMICONDUCTOR MEMORY DEVICE AND A METHOD OF OPERATING A BIT LINE SENSE AMPLIFIER OF THE SAME

CROSS-REFERENCE TO RELATED APPLICATION

This application claims priority under 35 U.S.C. §119 to Korean Patent Application No. 10-2015-0108897 filed on Jul. 31, 2015, the disclosure of which is incorporated by reference herein in its entirety.

TECHNICAL FIELD

Exemplary embodiments of the inventive concept relate to a semiconductor memory device with low power consumption and a system including the semiconductor memory device.

DESCRIPTION OF RELATED ART

Semiconductor memory devices are used to store data and are most often classified on the basis of whether they are volatile memory devices or nonvolatile memory devices. A volatile memory device such as a random access memory (RAM) can store or read data only while power is supplied and can lose the stored data when the power turns off. The volatile memory device stores data using a process of charging or discharging a capacitor.

In a mobile device including a semiconductor memory device and an application processor (AP), power consumed by the AP has been gradually decreased, but power consumed by the semiconductor memory device remains high.

SUMMARY

In accordance with an exemplary embodiment of the inventive concept, a semiconductor memory device may include a plurality of memory cells, a plurality of word lines and a plurality of bit lines, wherein each of the memory cells is connected to a respective word line and bit line. The semiconductor memory device includes a plurality of sense amplifiers, wherein each sense amplifier is coupled to two bit lines. The semiconductor memory device is configured to receive a first positive supply voltage, a second positive supply voltage, and a negative supply voltage, and determine a low level of an amplified voltage based on the negative supply voltage in an operation of amplifying data in a memory cell.

The PMIC generates a first positive supply voltage, a second positive supply voltage having a voltage level lower than the first positive supply voltage, and a negative supply voltage. The semiconductor memory device includes a plurality of memory cells, a plurality of word lines and a plurality of bit lines, wherein each memory cell is connected to a respective word line and bit line. The semiconductor memory device includes a plurality of sense amplifiers, wherein each sense amplifier is coupled to the plurality of bit lines, and the semiconductor memory device operates using the first positive supply voltage, the second positive supply voltage, and the negative supply voltage. The semiconductor memory device determines a low level of an amplified voltage based on the negative supply voltage in an operation of amplifying data in a memory cell.

In accordance with an exemplary embodiment of the inventive concept, a method of operating a bit line sense amplifier of a semiconductor memory device that includes a first memory cell connected to a bit line and a first word line, a second memory cell connected to a complementary bit line and a second word line, a precharge circuit, and a P-type sense amplifier and an N-type sense amplifier coupled to the bit line and the complementary bit line, comprises applying a precharge voltage having a voltage level of a ground voltage to the bit line and the complementary bit line; sensing first data of the first memory cell connected to the bit line; sensing second data of the second memory cell connected to the complementary bit line; decreasing a voltage of the complementary bit line to a voltage having a voltage level of a negative supply voltage; and increasing a voltage of the bit line to a voltage having a voltage level of half a cell supply voltage.

In accordance with an exemplary embodiment of the inventive concept, a semiconductor memory device may include: first and second memory cells, each connected to a first bit line and a second bit line, the first memory cell connected to a first wordline and the second memory cell connected to a second wordline; and a sense amplifier configured to apply a low level of an amplified voltage to the first and second bit lines, wherein the low level of the amplified voltage is based on a negative supply voltage.

BRIEF DESCRIPTION OF THE DRAWINGS

The foregoing and other features of the inventive concept will become more apparent by describing in detail exemplary embodiments thereof with reference to the accompanying drawings. In the drawings.

DETAILED DESCRIPTION OF THE EMBODIMENTS

Exemplary embodiments of the inventive concept are described below more fully with reference to the accompany drawings. It is to be understood that the inventive concept may be embodied in many alternate forms and should not be construed as limited to the embodiments set forth herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Figure 1:
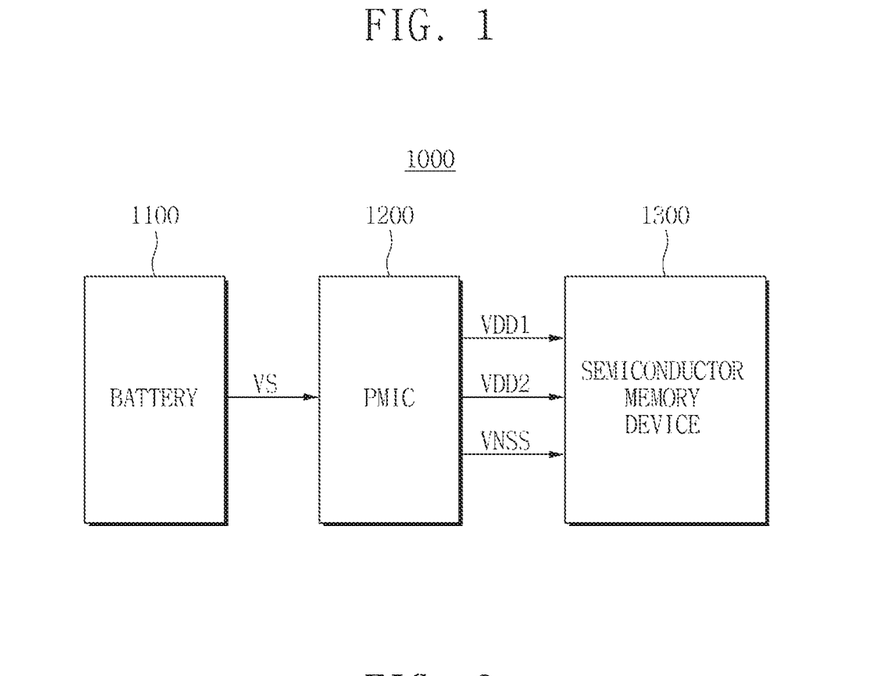
FIG. 1 is a block diagram illustrating a system that generates supply voltages used in a semiconductor memory device according to an exemplary embodiment of the inventive concept.

FIG. 1 is a block diagram illustrating a system 1000 that generates supply voltages used in a semiconductor memory device according to an exemplary embodiment of the inventive concept.

Referring to FIG. 1, the system 1000 may include a battery 1100, a power management integrated circuit (PMIC) 1200, and a semiconductor memory device 1300. The battery 1100 generates a supply voltage VS. The PMIC 1200 generates a first positive supply voltage VDD1, a second positive supply voltage VDD2 at a voltage level lower than the first positive supply voltage VDD1, and a negative supply voltage VNSS based on the supply voltage VS received from the battery 1100.

The semiconductor memory device 1300 may include a plurality of memory cells, a plurality of word lines and a plurality of bit lines, wherein each memory cell is connected to a respective word line and bit line. The semiconductor memory device 1300 may include a plurality of sense amplifiers, wherein each sense amplifier is coupled to two bit lines. The semiconductor memory device 1300 operates using the first positive supply voltage VDD1, the second positive supply voltage VDD2, and the negative supply voltage VNSS. The semiconductor memory device 1300 may determine a low level of an amplified voltage based on the negative supply voltage VNSS in an amplification operation of data in a memory cell.

Figure 2:
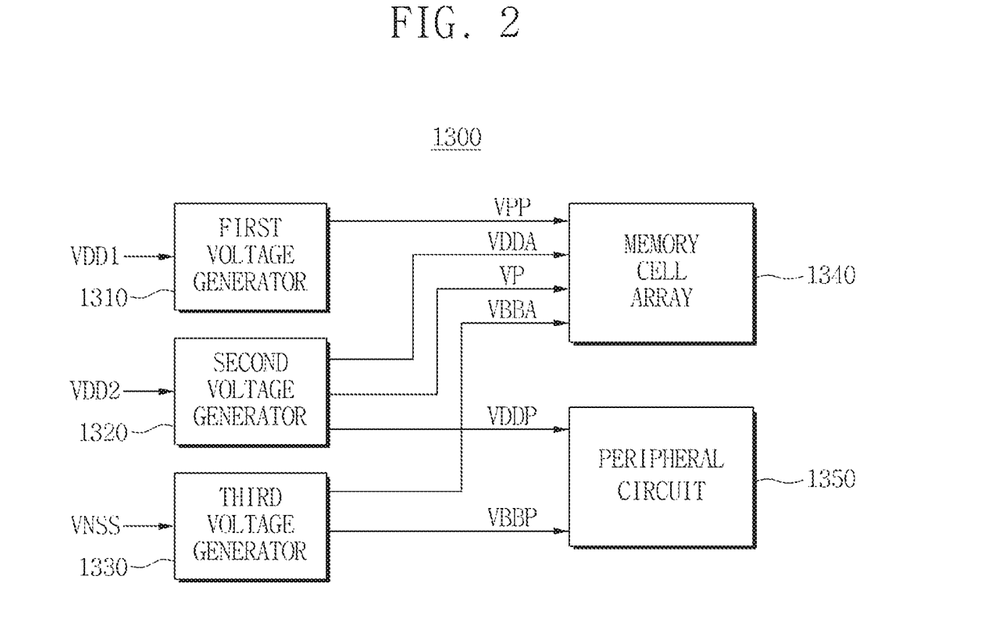
FIG. 2 is a block diagram illustrating a structure of the semiconductor memory device included in the system of FIG. 1, according to an exemplary embodiment of the inventive concept.

FIG. 2 is a block diagram illustrating a structure of the semiconductor memory device included in the system of FIG. 1, according to an exemplary embodiment of the inventive concept.

Referring to FIG. 2, the semiconductor memory device 1300 may include a first voltage generator 1310, a second voltage generator 1320, a third voltage generator 1330, a memory cell array 1340, and a peripheral circuit 1350.

The first voltage generator 1310 boosts the first positive supply voltage VDD1 to generate a boosted voltage VPP. The second voltage generator 1320 lowers the second positive supply voltage VDD2 to generate a cell supply voltage VDDA, a plate voltage VP, and a supply voltage VDDP for the peripheral circuit 1350. The third voltage generator 1330 generates a negative supply voltage VBBA for a cell array and a negative supply voltage VBBP for the peripheral circuit 1350 in response to the negative supply voltage VNSS. For example, the third voltage generator 1330 may adjust a voltage level of the negative supply voltage VNSS to generate the negative supply voltage for the peripheral circuit VBBP. The memory cell array 1340 operates using the boosted voltage VPP, the cell supply voltage VDDA, the plate voltage VP, and the negative supply voltage VBBA for the cell array. The peripheral circuit 1350 operates using the supply voltage VDDP for the peripheral circuit and the negative supply voltage VBBP for the peripheral circuit. The peripheral circuit 1350 may include an input/output (I/O) sense amplifier coupled to an I/O circuit of the semiconductor memory device 1300. The semiconductor memory device 1300 may use the negative supply voltage for the peripheral circuit VBBP as a back bias voltage for preventing a leakage current of MOS transistors included in the peripheral circuit 1350.

Figure 3:
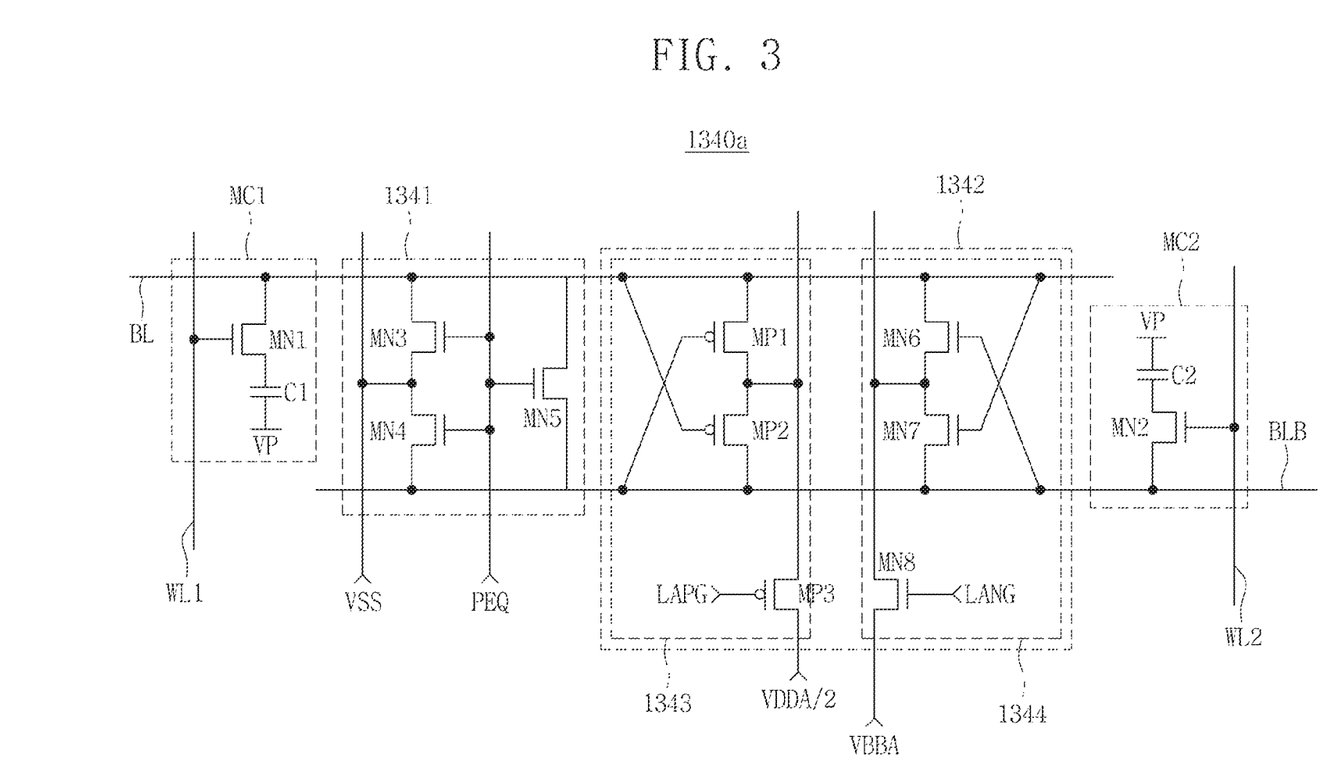
FIG. 3 is a circuit diagram illustrating a part of a memory cell array included in the semiconductor memory device of FIG. 2, according to an exemplary embodiment of the inventive concept.

FIG. 3 is a circuit diagram illustrating a part of the memory cell array included in the semiconductor memory device of FIG. 2, according to an exemplary embodiment of the inventive concept.

Referring to FIG. 3, the memory cell array 1340a may include a first memory cell MC1 connected to a bit line BL and a first word line WL1, a second memory cell MC2 connected to a complementary bit line BLB and a second word line WL2, and a precharge circuit 1341 and a sense amplifier 1342 connected between the bit line BL and the complementary bit line BLB. The sense amplifier 1342 may include a P-type sense amplifier 1343 and an N-type sense amplifier 1344. The first memory cell MC1 may include a first cell transistor MN1 having a drain connected to the bit line BL and a gate connected to the first word line WL1, and a first capacitor C1 connected between a source of the first cell transistor MN1 and a plate voltage VP. The second memory cell MC2 may include a second cell transistor MN2 having a drain connected to the complementary bit line BLB and a gate connected to the second word line WL2, and a second capacitor C2 connected between a source of the second cell transistor MN2 and the plate voltage VP. When the first word line WL1 is activated, the first cell transistor MN1 is turned on, and data stored in the first capacitor C1 is output to the bit line BL. When the second word line WL2 is activated, the second cell transistor MN2 is turned on, and data stored in the second capacitor C2 is output to the complementary bit line BLB.

The precharge circuit 1341 includes NMOS transistors MN3, MN4, and MN5. The NMOS transistors MN3, MN4, and MN5 are turned on in response to a control signal PEQ, and a ground voltage VSS is provided to the bit line BL and the complementary bit line BLB. The NMOS transistor MN5 maintains the bit line BL and the complementary bit line BLB at the same potential level.

The P-type sense amplifier 1343 includes PMOS transistors MP1, MP2, and MP3, and supplies a high level of the amplified voltage to the bit line BL or the complementary bit line BLB. The N-type sense amplifier 1344 includes NMOS transistors MN6, MN7, and MN8, and supplies a low level of the amplified voltage to the bit line BL or the complementary bit line BLB.

When the voltage level of the bit line BL is higher than the voltage level of the complementary bit line BLB, the PMOS transistor MP1 is turned on and the PMOS transistor MP2 is turned off. In this condition, when the PMOS transistor MP3 is activated, a voltage VDDA/2 which is half of a cell supply voltage VDDA is provided to the bit line BL through the PMOS transistor MP1 in response to a gate control signal LAPG. When the PMOS transistor MP3 is activated, the gate control signal LAPG may have a voltage level of the negative supply voltage VNSS. Further, when the voltage level of the bit line BL is higher than the voltage level of the complementary bit line BLB, the NMOS transistor MN7 is turned on and the NMOS transistor MN6 is turned off. In this condition, when the NMOS transistor MN8 is activated, a negative supply voltage VBBA for a cell array is provided to the complementary bit line BLB through the NMOS transistor MN7 in response to a gate control signal LANG. The negative supply voltage VBBA for the cell array may be generated based on the negative supply voltage VNSS. The negative supply voltage VBBA for the cell array may have a voltage level of the negative supply voltage VNSS.

Figure 4:
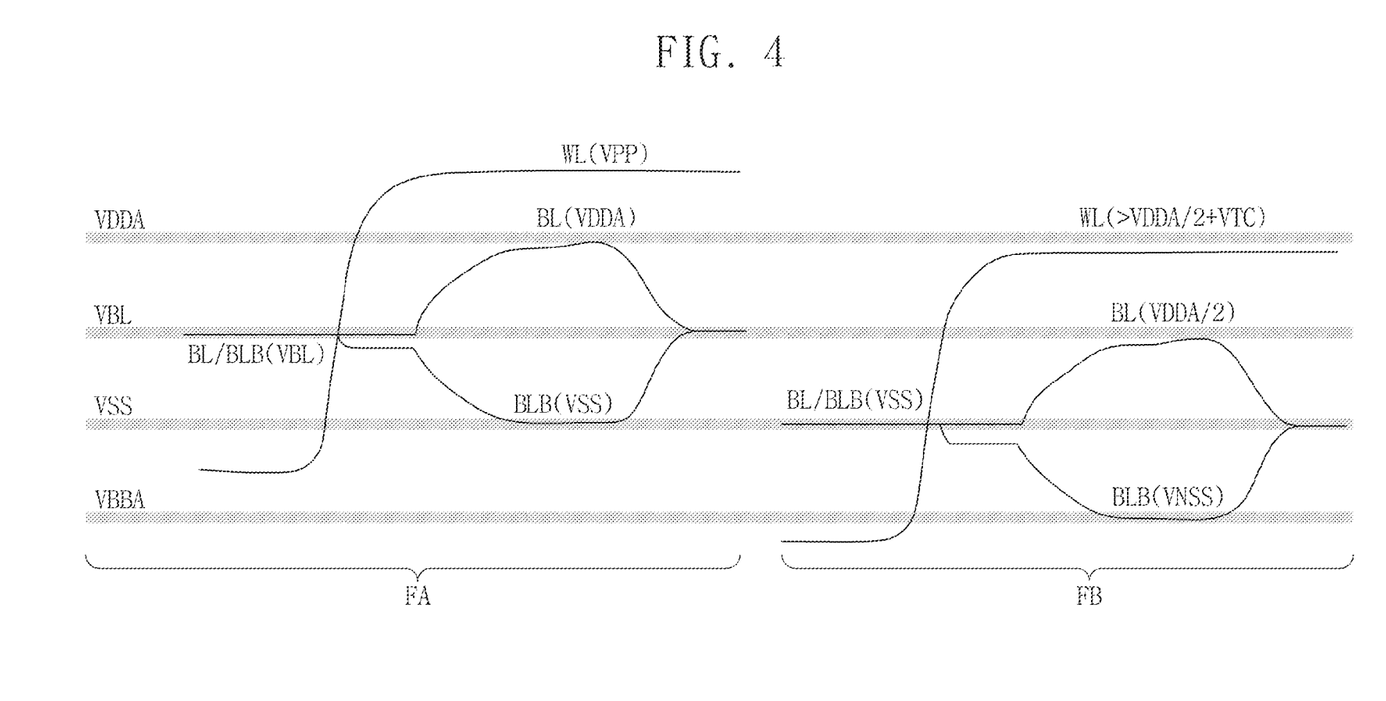
FIG. 4 is a diagram illustrating a process of amplifying data output from memory cells included in a memory cell array.

FIG. 4 is a diagram illustrating a process of amplifying data output from memory cells included in a memory cell array. The left part FA of FIG. 4 shows the process of amplifying data in a conventional semiconductor memory device, and the right part FB of FIG. 4 shows the process of amplifying data in a semiconductor memory device according to an exemplary embodiment of the inventive concept. In FIG. 4, an example is shown when the voltage level of the bit line BL is higher than the voltage level of the complementary bit line BLB.

Referring to FIG. 4, the semiconductor memory device according to an exemplary embodiment of the inventive concept may determine a low level of an amplified voltage based on the negative supply voltage VNSS in an operation of amplifying data in a memory cell. The low level of the amplified voltage may be a voltage level of the negative supply voltage VNSS. The high level of the amplified voltage may be a voltage level of a conventional bit line precharge voltage (VBL). According to the semiconductor memory device of the present embodiment, the high level of the amplified voltage may be VDDA/2 which is half of a cell supply voltage VDDA. In the semiconductor memory device of the present embodiment, the ground voltage VSS may be used for the bit line precharge voltage (VBL). When a word line is activated, a voltage at a voltage level higher than a voltage level VDDA/2+VTC, which is half of a cell supply voltage VDDA added to a threshold voltage VTC of a cell transistor, may be applied to a gate of the cell transistor included in each of the memory cells connected to the word line of the semiconductor memory device of the present embodiment. In other words, a voltage having a voltage level higher than VDDA/2+VTC may be applied to the word line.

According to the present embodiment, when a word line is inactivated, a voltage determined based on the negative supply voltage VNSS may be applied to a gate of the cell transistor included in each of the memory cells connected to the word line.

Therefore, in the semiconductor memory device of the present embodiment, voltage levels applied to bit lines, complementary bit lines, and word lines may be decreased compared with the conventional semiconductor memory device which applies VPP to its word line. The decreased voltage is applied to the bit lines, complementary bit lines, and word lines by determining the low level of the amplified voltage based on the negative supply voltage in an operation of amplifying data in a memory cell. Therefore, the level of the cell supply voltage VDDA may be decreased, and therefore supply voltages VDD1 and VDD2 of FIG. 1 applied to the semiconductor memory device 1300 may be decreased. Therefore, the power consumed in the peripheral circuit 1350 of FIG. 2 of the semiconductor memory device 1300 may be decreased. Accordingly, the power consumed in the semiconductor memory device of the present embodiment may be decreased without influencing the amplifying operation of a bit line sense amplifier.

Figure 5:
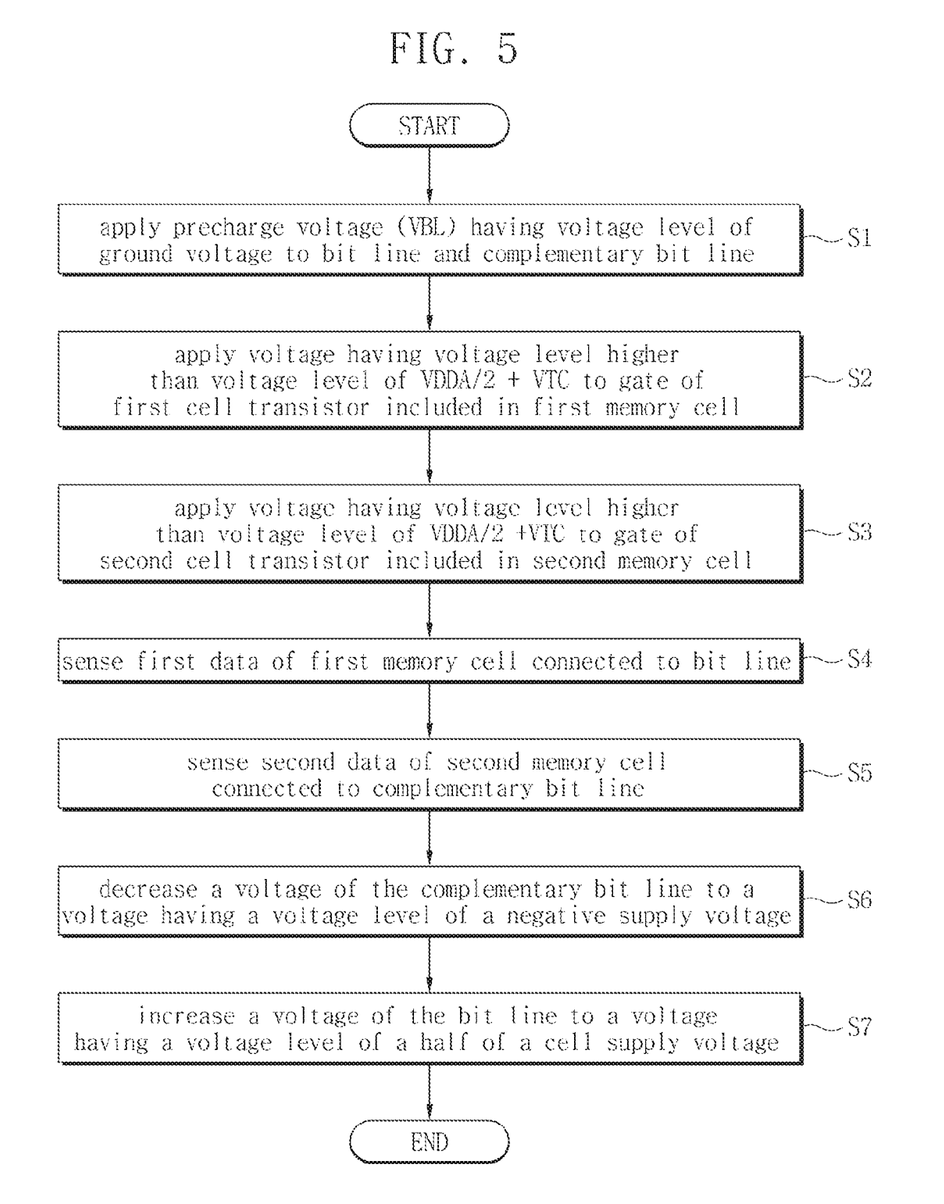
FIGS. 5, 6 and 7 are flowcharts illustrating methods of operating a bit line sense amplifier of a semiconductor memory device according to an exemplary embodiment of the inventive concept.
Figure 6:
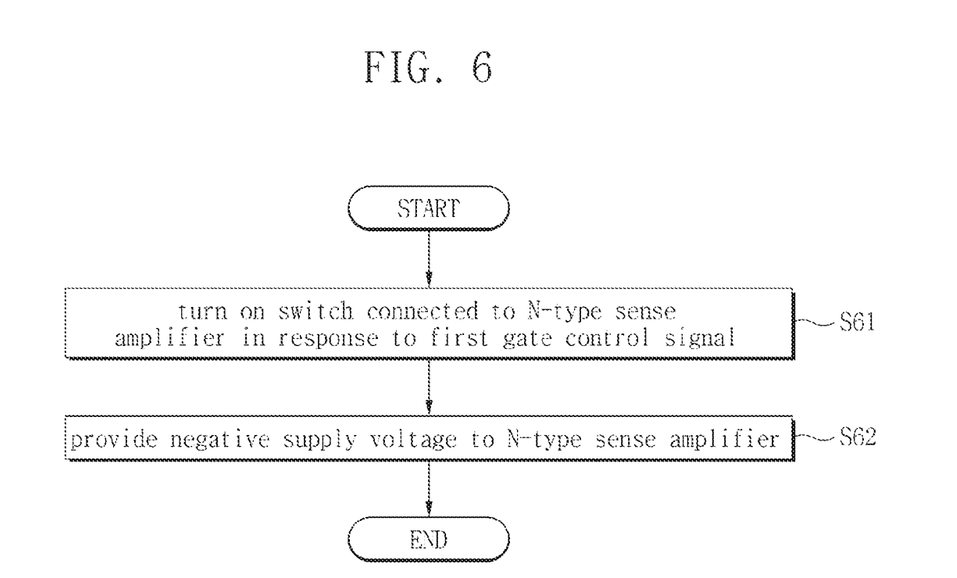
Figure 7:
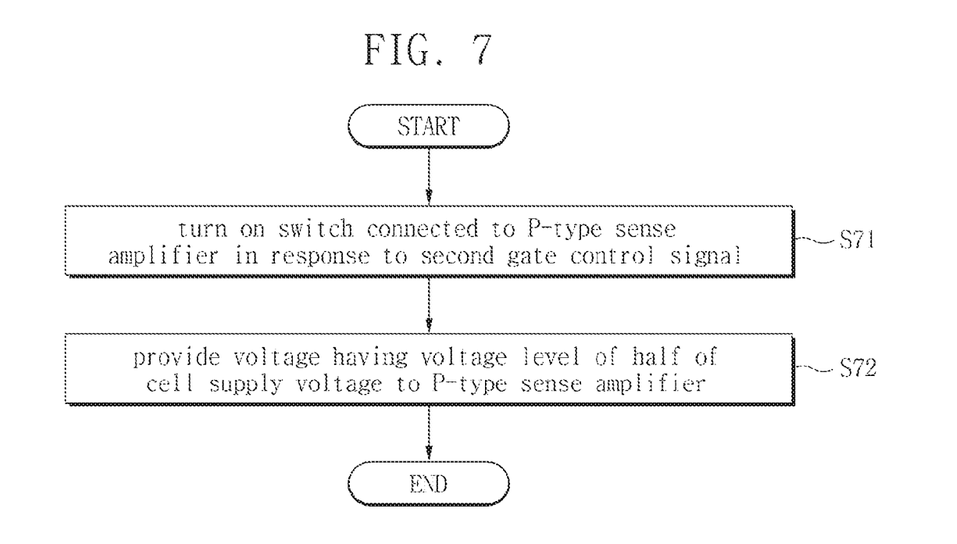

FIGS. 5, 6 and 7 are flowcharts illustrating methods of operating a bit line sense amplifier of a semiconductor memory device according to an exemplary embodiment of the inventive concept.

Referring to FIG. 5, a method of operating a bit line sense amplifier of a semiconductor memory device according to an exemplary embodiment of the inventive concept may include the following operations (1 to 7).

1) applying a precharge voltage (VBL) at a voltage level of a ground voltage to the bit line and the complementary bit line (S1).

2) when the first word line is activated, applying a voltage at a voltage level higher than a voltage level of VDDA/2+VTC, which is half of the cell supply voltage VDDA added to a threshold voltage VTC of a first cell transistor, to a gate of the first cell transistor included in the first memory cell (S2).

3) when the second word line is activated, applying a voltage having a voltage level higher than a voltage level of VDDA/2+VTC, which is half of the cell supply voltage VDDA added to a threshold voltage VTC of a second cell transistor, to a gate of the second cell transistor included in the second memory cell (S3).

4) sensing first data of the first memory cell connected to the bit line (S4).

5) sensing second data of the second memory cell connected to the complementary bit line (S5).

6) decreasing a voltage of the complementary bit line to a voltage having a voltage level of a negative supply voltage (S6).

7) increasing a voltage of the bit line to a voltage having a half of a voltage level of a cell supply voltage (S7).

Referring to FIG. 6, the decreasing of the voltage of the complementary bit line to the voltage having the voltage level of the negative supply voltage (S6) may include the following operations.

1) turning on a switch connected to the N-type sense amplifier in response to a first gate control signal (S61).

2) providing the negative supply voltage to the N-type sense amplifier (S62).

Referring to FIG. 7, the increasing of the voltage of the bit line to the voltage having the half voltage level of the cell supply voltage (S7) may include the following operations.

1) turning on a switch connected to the P-type sense amplifier in response to a second gate control signal (S71).

2) providing the voltage having a half voltage level of a cell supply voltage to the P-type sense amplifier (S72).

Figure 8:
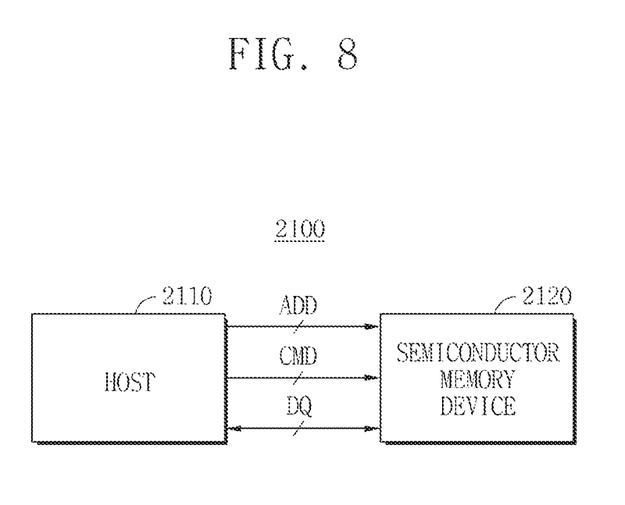
FIG. 8 is a block diagram illustrating a memory system including a semiconductor memory device according to an exemplary embodiment of the inventive concept.

FIG. 8 is a block diagram illustrating a memory system including a semiconductor memory device according to an exemplary embodiment of the inventive concept.

Referring to FIG. 8, the memory system 2100 may include a host 2110 and a semiconductor memory device 2120.

The host 2110 may generate an address signal ADD and a command CMD, and provide the address signal ADD and the command CMD to the semiconductor memory device 2120 through buses. Data DQ may be transmitted from the host 2110 to the semiconductor memory device 2120 through the buses, or transmitted from the semiconductor memory device 2120 to the host 2110 through the buses.

The semiconductor memory device 2120 may include a semiconductor memory device according to an exemplary embodiment of the inventive concept. Therefore, in the semiconductor memory device 2120, voltage levels applied to bit lines, complementary bit lines, and word lines may be decreased by determining a low level of an amplified voltage based on a negative supply voltage in an operation of amplifying data in a memory cell. Therefore, data sensing and the amplification operation by a bit line sense amplifier can be normally performed even when low supply voltages are used. Further, voltage levels of supply voltages used by a peripheral circuit including the I/O sense amplifier can be decreased. Therefore, the power consumption of the semiconductor memory device 2120 and a system including the semiconductor memory device 2120 can be reduced.

Figure 9:
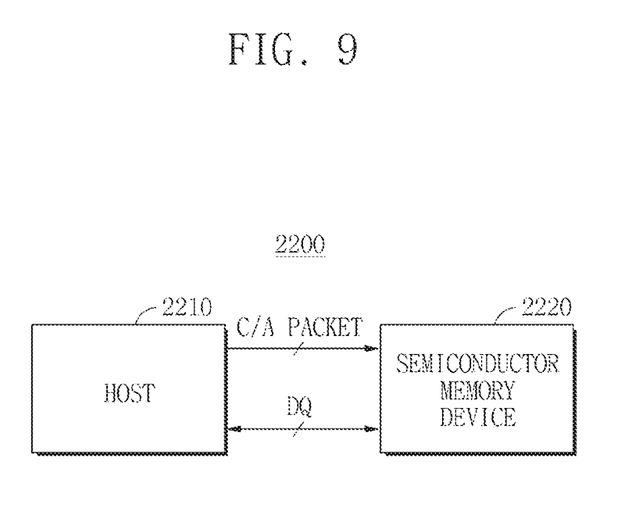
FIG. 9 is a block diagram illustrating a memory system including a semiconductor memory device according to an exemplary embodiment of the inventive concept.

FIG. 9 is a block diagram illustrating a memory system including a semiconductor memory device according to an exemplary embodiment of the inventive concept.

Referring to FIG. 9, the memory system 2200 may include a host 2210 and a semiconductor memory device 2220. The host 2210 may generate an address signal ADD and a command CMD, and provide the address signal ADD and the command CMD to the semiconductor memory device 2220 through buses. Data DQ may be transmitted from the host 2210 to the semiconductor memory device 2220 through the buses, or transmitted from the semiconductor memory device 2220 to the host 2210 through the buses.

Unlike the memory system 2100 of FIG. 8, the memory system 2200 of FIG. 9 uses a signal C/A in which the command CMD and an address signal ADD are packetized. Otherwise, the memory system 2100 of FIG. 8 and the memory system 2200 of FIG. 9 are essentially the same.

Figure 10:
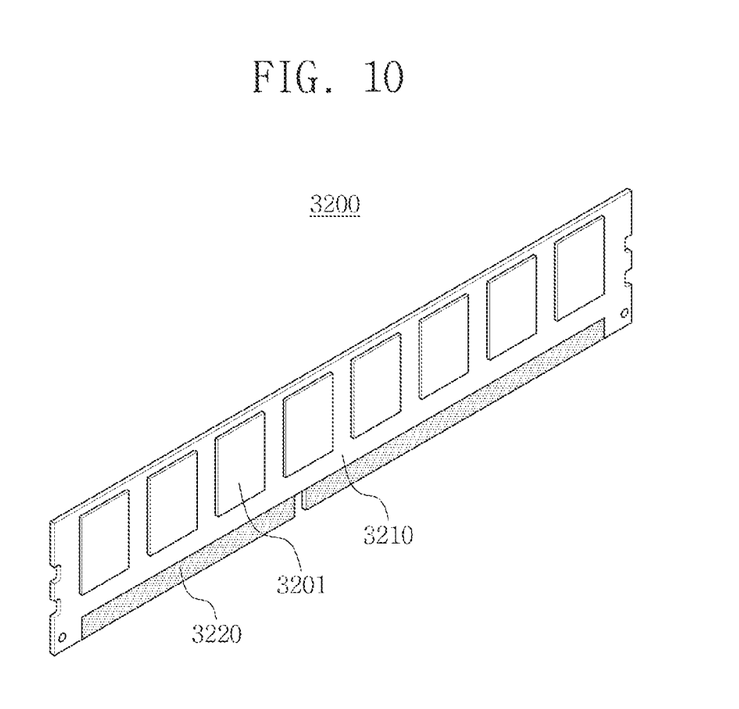
FIGS. 10, 11 and 12 are views illustrating memory modules including a semiconductor memory device according to an exemplary embodiment of the inventive concept.
Figure 11:
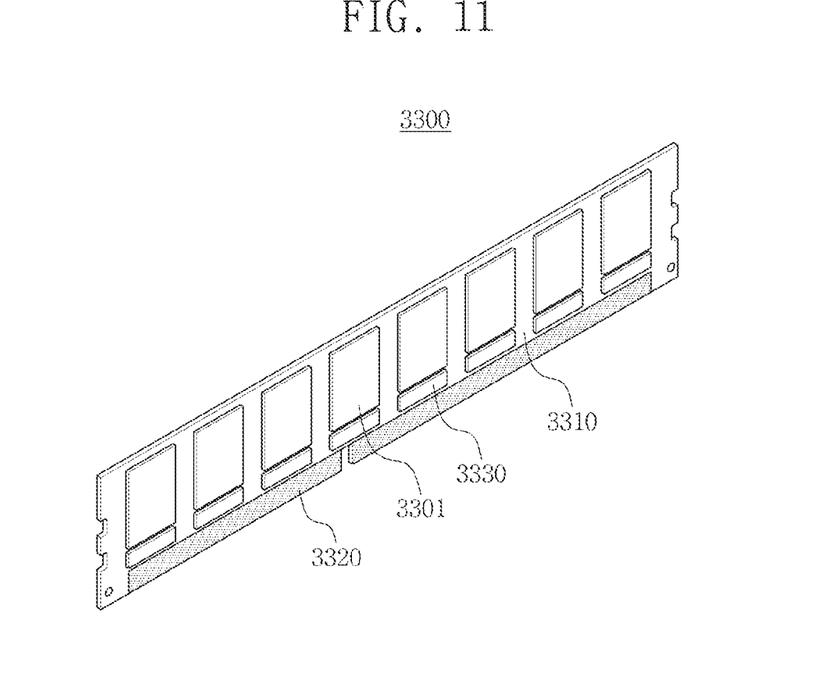
Figure 12:
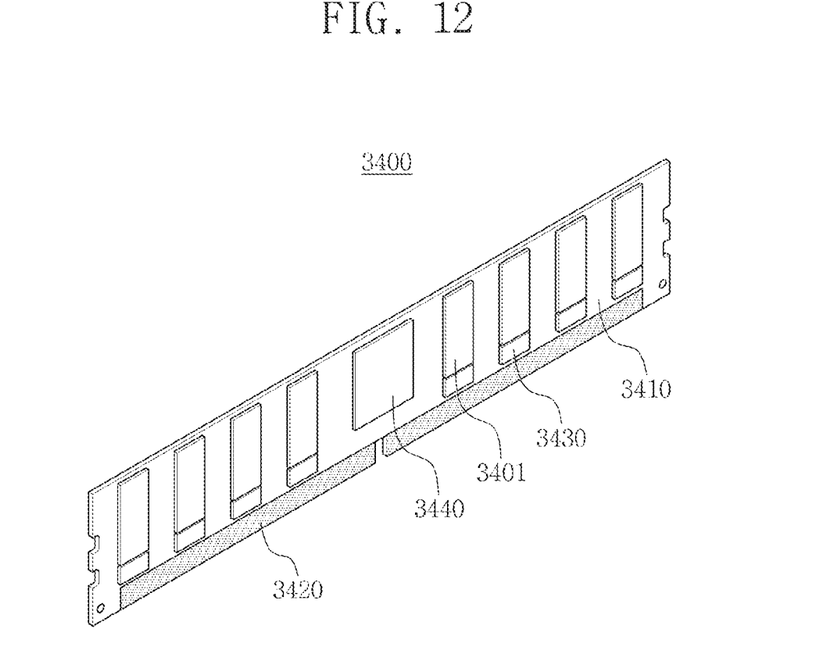

FIGS. 10, 11 and 12 are diagrams illustrating memory modules 3200, 3300, and 3400 each module including a semiconductor memory device according to an exemplary embodiment of the inventive concept.

Referring to FIG. 10, the memory module 3200 may include a plurality of semiconductor memory devices 3201, a printed circuit board (PCB) 3210, and a connector 3220. The plurality of semiconductor memory devices 3201 may be bonded to upper and lower surfaces of the PCB 3210. The connector 3220 may be electrically connected to the plurality of semiconductor memory devices 3201 through conductive lines. In addition, the connector 3220 may be connected to a slot of an external host. In the semiconductor memory devices 3201, voltage levels applied to bit lines, complementary bit lines, and word lines may be decreased by determining a low level of an amplified voltage based on a negative supply voltage in an operation of amplifying data in a memory cell.

Referring to FIG. 11, the memory module 3300 may include a plurality of semiconductor memory devices 3301, a PCB 3310, a connector 3320, and a plurality of buffers 3330. One of the plurality of buffers 3330 may be disposed between each semiconductor memory device 3301 and the connector 3320.

The plurality of buffers 3330 connected to the plurality of semiconductor memory devices 3301 may be provided on upper and lower surfaces of the PCB 3310. The semiconductor memory devices 3301 and the buffers 3330 formed on the upper and lower surfaces of the PCB 3310 may be connected through a plurality of via holes. In the semiconductor memory devices 3301, voltage levels applied to bit lines, complementary bit lines, and word lines may be decreased by determining a low level of an amplified voltage based on a negative supply voltage in an operation of amplifying data in a memory cell.

Referring to FIG. 12, the memory module 3400 may include a plurality of semiconductor memory devices 3401, a PCB 3410, a connector 3420, a plurality of buffers 3430, and a controller 3440.

The plurality of buffers 3430 connected to the plurality of semiconductor memory devices 3401 may be provided on upper and lower surfaces of the PCB 3410. The semiconductor memory devices 3401 and the buffers 3430 formed on the upper and lower surfaces of the PCB 3410 may be connected through a plurality of via holes. The controller 3440 transmits a control signal to each of the plurality of semiconductor memory devices 3401, and transmits or receives data to or from each of the plurality of semiconductor memory devices 3401. In the semiconductor memory devices 3401, voltage levels applied to bit lines, complementary bit lines, and word lines may be decreased by determining a low level of an amplified voltage based on a negative supply voltage in an operation of amplifying data in a memory cell.

Figure 13:
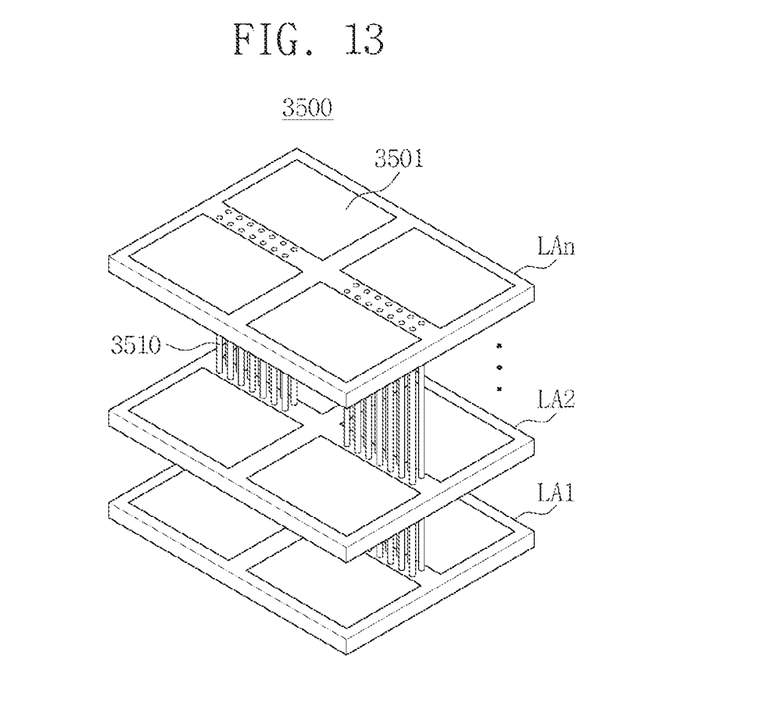
FIG. 13 is a perspective view of a semiconductor device having a stacked structure including a plurality of semiconductor layers.

FIG. 13 is a perspective view of a stacked semiconductor device 3500 including a plurality of semiconductor layers. In the memory modules 3200, 3300, and 3400 of FIGS. 10 to 12, each of the semiconductor memory devices 3201, 3301, and 3401 may include a plurality of semiconductor layers LA1 to LAn.

Referring to FIG. 13, in the stacked semiconductor device 3500, the plurality of stacked semiconductor layers LA1 to LAn may be connected to each other through through-silicon vias (TSVs) 3510. Each of the plurality of stacked semiconductor layers LA1 to LAn may include memory blocks 3501.

Figure 14:
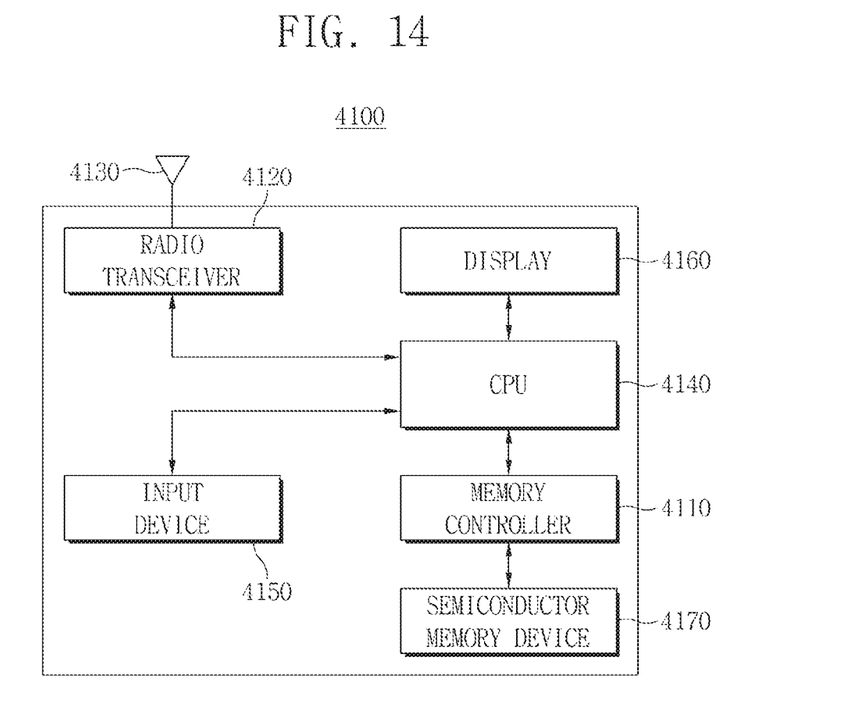
FIG. 14 is a block diagram illustrating a computer system including a semiconductor memory device according to an exemplary embodiment of the inventive concept.

FIG. 14 is a block diagram illustrating a computer system 4100 including a semiconductor memory device according to an exemplary embodiment of the inventive concept.

Referring to FIG. 14, the computer system 4100 may include semiconductor memory devices 4170, a memory controller 4110 which controls the semiconductor memory devices 4170, a radio transceiver 4120, an antenna 4130, a central processing unit (CPU) 4140, an input device 4150, and a display 4160.

The radio transceiver 4120 may transmit or receive a radio signal through the antenna 4130. Further, the radio transceiver 4120 may convert the radio signal received from the antenna 4130 into a signal to be processed in the CPU 4140.

The CPU 4140 may process the signal output from the radio transceiver 4120 and transmit the processed signal to the display 4160. Further, the radio transceiver 4120 may convert the signal output from the CPU 4140 to a wireless signal and output the converted wireless signal to external devices through the antenna 4130.

The input device 4150 is a device capable of inputting a control signal for controlling the operation of the CPU 4140 or data to be processed by the CPU 4140, and may be implemented as pointing devices such as a touch pad and a computer mouse, a keypad, or a keyboard.

In the computer system 4100 shown in FIG. 14, the semiconductor memory device 4170 may be a semiconductor memory device according to an exemplary embodiment of the inventive concept. For example, in the semiconductor memory device 4170, voltage levels applied to bit lines, complementary bit lines, and word lines may be decreased by determining a low level of an amplified voltage based on a negative supply voltage in an operation of amplifying data in a memory cell.

Figure 15:
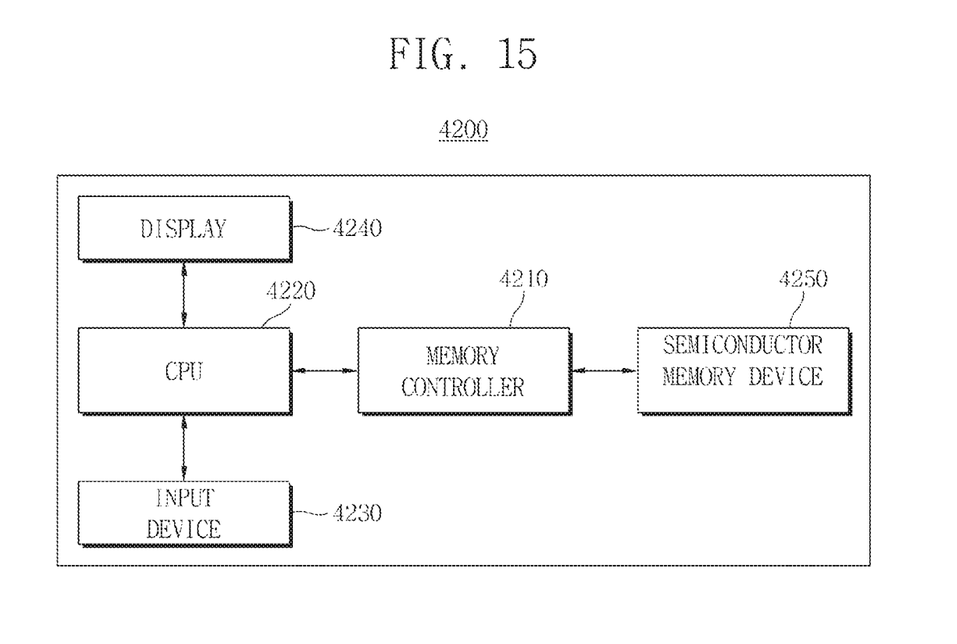
FIG. 15 is a block diagram illustrating a computer system including a semiconductor memory device according to an exemplary embodiment of the inventive concept.

FIG. 15 is a block diagram illustrating a computer system 4200 including a semiconductor memory device according to an exemplary embodiment of the inventive concept.

The computer system 4200 of FIG. 20 may be implemented as a personal computer (PC), a network server, a tablet PC, a net-book, an e-reader, a personal digital assistant (PDA), a portable multimedia player (PMP), an MP3 player, or an MP4 player.

The computer system 4200 may include a semiconductor memory device 4250, a memory controller 4210 which controls a data processing operation of the semiconductor memory device 4250, a CPU 4220, an input device 4230, and a display 4240.

The CPU 4220 may display data stored in the semiconductor memory device 4250 through the display 4240 according to data received through the input device 4230. For example, the input device 4230 may be implemented as pointing devices such as a touch pad and a computer mouse, a keypad, or a keyboard. The CPU 4220 may control overall operations of the computer system 4200, and may control an operation of the memory controller 4210.

In an exemplary embodiment of the inventive concept, the memory controller 4210 capable of controlling an operation of the semiconductor memory device 4250 may be implemented as a part of the CPU 4220, or as a chip separate from the CPU 4220. The semiconductor memory device 4250 may be a semiconductor memory device according to an exemplary embodiment of the inventive concept. For example, in the semiconductor memory device 4250, voltage levels applied to bit lines, complementary bit lines, and word lines may be decreased by determining a low level of an amplified voltage based on a negative supply voltage in an operation of amplifying data in a memory cell.

Figure 16:
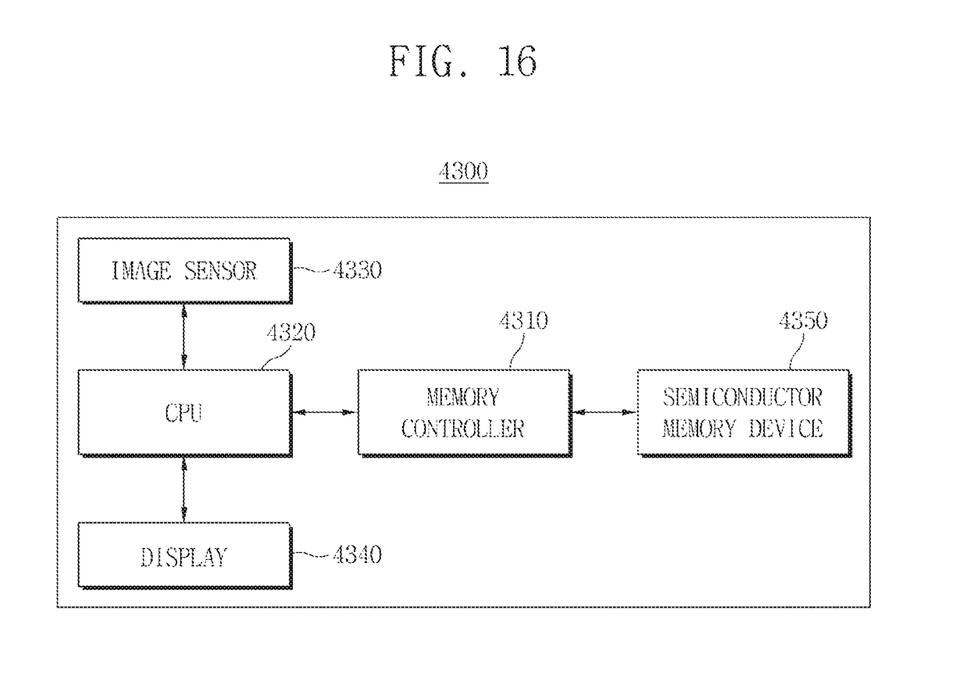
FIG. 16 is a block diagram illustrating a computer system including a semiconductor memory device according to an exemplary embodiment of the inventive concept.

FIG. 16 is a block diagram illustrating an exemplary embodiment of a computer system 4300 including a semiconductor memory device according to an exemplary embodiment of the inventive concept.

The computer system 4300 of FIG. 16 may be implemented as an image processing device such as a digital camera, a mobile phone, a smart phone, or a tablet including a digital camera.

The computer system 4300 may include a semiconductor memory device 4350, a memory controller 4310 capable of controlling a data processing operation including a write operation and a read operation of the semiconductor memory device 4350. In addition, the computer system 4300 may further include a CPU 4320, an image sensor 4330, and a display 4340.

The image sensor 4330 of the computer system 4300 converts an optical image into digital signals and transmits the converted digital signals to the CPU 4320 or the memory controller 4310. According to the control of the CPU 4320, the converted digital signals may be displayed through the display 4340 or stored in the semiconductor memory device 4350 through the memory controller 4310.

Further, the data stored in the semiconductor memory device 4350 may be displayed through the display 4340 according to the control of the CPU 4320 or the memory controller 4310. In an exemplary embodiment of the inventive concept, the memory controller 4310 capable of controlling an operation of the semiconductor memory device 4350 may be implemented as a part of the CPU 4320, or as a chip separate from the CPU 4320.

In the computer system 4300 of FIG. 16, the semiconductor memory device 4350 may be a semiconductor memory device according to an exemplary embodiment of the inventive concept. For example, in the semiconductor memory device 4350, voltage levels applied to bit lines, complementary bit lines, and word lines may be decreased by determining a low level of an amplified voltage based on a negative supply voltage in an operation of amplifying data in a memory cell.

As described above, a semiconductor memory device according to an exemplary embodiment of the inventive concept may decrease voltage levels applied to bit lines, complementary bit lines, and word lines by determining a low level of an amplified voltage based on a negative supply voltage in an operation of amplifying data in a memory cell. Therefore, data sensing and the amplification operation by a bit line sense amplifier can be normally performed even when low supply voltages are used. Further, voltage levels of supply voltages used by a peripheral circuit including the I/O sense amplifier can be decreased. Therefore, the power consumption of the semiconductor memory device and a system including the semiconductor memory device can be reduced.

An exemplary embodiment of the inventive concept may be applied to a semiconductor device and a memory system including the same.

While the inventive concept has been described with reference to exemplary embodiments thereof, it will be understood by those skilled in the art that various changes and modifications may be made thereto without departing from the spirit and scope of the inventive concept as defined by the appended claims.

What is claimed is:

1. A semiconductor memory device, comprising:
    a plurality of memory cells, a plurality of word lines and a plurality of bit lines, wherein each memory cell is coupled to a respective word line and bit line; and
    a plurality of sense amplifiers, wherein each sense amplifier is coupled to two bit lines,
    wherein the semiconductor memory device is configured to receive a first positive supply voltage, a second positive supply voltage, and a negative supply voltage, and determine a low level of an amplified voltage based on the negative supply voltage in an operation of amplifying data in a memory cell,
    wherein a high level of the amplified voltage is half of a cell supply voltage in the operation of amplifying data in the memory cell,
    wherein when a word line is activated, a voltage having a voltage level higher than half of the cell supply voltage added to a threshold voltage of a cell transistor and lower than a boosted voltage is applied to a gate of the cell transistor included in each of the memory cells connected to the word line.

2. The semiconductor memory device of claim 1, wherein a ground voltage is used as a bit line precharge voltage.

3. The semiconductor memory device of claim 1, wherein the low level of the amplified voltage is a voltage level of the negative supply voltage.

4. The semiconductor memory device of claim 1, wherein when a word line is inactivated, a voltage determined based on the negative supply voltage is applied to a gate of a cell transistor included in each of the memory cells connected to the word line.

5. The semiconductor memory device of claim 1, wherein at least one of the sense amplifiers comprises:
    an N-type sense amplifier configured to supply the low level of the amplified voltage to two of the bit lines; and
    a P-type sense amplifier configured to supply the high level of the amplified voltage to two of the bit lines.

6. The semiconductor memory device of claim 5, wherein the sense amplifier further comprises a P-MOS transistor activated by the negative supply voltage and configured to supply the high level of the amplified voltage to the P-type sense amplifier.

7. The semiconductor memory device of claim 5, wherein the sense amplifier further comprises an N-MOS transistor activated by a gate control voltage and configured to supply the low level of the amplified voltage to the N-type sense amplifier.

8. The semiconductor memory device of claim 1, further comprising:
- a first voltage generator configured to boost the first positive supply voltage to generate a boosted voltage;
- a second voltage generator configured to lower the second positive supply voltage to generate the cell supply voltage, a plate voltage, and a supply voltage for a peripheral circuit;
- a third voltage generator configured to generate a negative supply voltage for a cell array and a negative supply voltage for the peripheral circuit;
- a memory cell array configured to operate using the boosted voltage, the cell supply voltage, the plate voltage, and the negative supply voltage for the cell array; and
- the peripheral circuit configured to operate using the supply voltage for the peripheral circuit and the negative supply voltage for the peripheral circuit.

9. The semiconductor memory device of claim 8, wherein the third voltage generator is configured to adjust a voltage level of the negative supply voltage to generate the negative supply voltage for the peripheral circuit.

10. The semiconductor memory device of claim 8, wherein the semiconductor memory device is configured to use the negative supply voltage for the peripheral circuit as a back bias voltage.

11. A method of operating a bit line sense amplifier of a semiconductor memory device, the semiconductor memory device including a first memory cell connected to a bit line and a first word line, a second memory cell connected to a complementary bit line and a second word line, a precharge circuit, and a P-type sense amplifier and an N-type sense amplifier coupled to the bit line and the complementary bit line, the method comprising:
- applying a precharge voltage having a voltage level of a ground voltage to the bit line and the complementary bit line;
- sensing first data of the first memory cell connected to the bit line;
- sensing second data of the second memory cell connected to the complementary bit line;
- decreasing a voltage of the complementary bit line to a voltage having a voltage level of a negative supply voltage; and
- increasing a voltage of the bit line to a voltage having a voltage level of half a cell supply voltage,
- when the first word line is activated, applying a voltage having a voltage level higher than half of the cell supply voltage added to a threshold voltage of a first cell transistor to a gate of the first cell transistor included in the first memory cell; and
- when the second word line is activated, applying a voltage having a voltage level higher than half of the cell supply voltage added to a threshold voltage of a second cell transistor to a gate of the second cell transistor included in the second memory cell.

12. The method of claim 11, wherein the decreasing of the voltage of the complementary bit line to the voltage having the voltage level of the negative supply voltage comprises:
- turning on a switch connected to the N-type sense amplifier in response to a first gate control signal; and
- providing the negative supply voltage to the N-type sense amplifier.

13. The method of claim 12, wherein the switch includes an NMOS transistor.

14. The method of claim 11, wherein the increasing of the voltage of the bit line to the voltage having the voltage level of half of the cell supply voltage comprises:
- turning on a switch connected to the P-type sense amplifier in response to a second gate control signal; and
- providing the voltage having the voltage level of half of the cell supply voltage to the P-type sense amplifier.

15. The method of claim 14, wherein the switch includes a PMOS transistor.

16. The method of claim 15, wherein the PMOS transistor is activated in response to the negative supply voltage.

17. A semiconductor memory device, comprising:
- first and second memory cells, each connected to a first bit line and a second bit line, the first memory cell connected to a first wordline and the second memory cell connected to a second wordline; and
- a sense amplifier configured to apply a low level or a high level of an amplified voltage to the first and second bit lines, wherein the low level of the amplified voltage is based on a negative supply voltage,
- wherein the high level of the amplified voltage is half of a cell supply voltage in the operation of amplifying data in the memory cell,
- wherein when a word line is activated, a voltage having a voltage level higher than half of the cell supply voltage added to a threshold voltage of a cell transistor and lower than a boosted voltage is applied to a gate of the cell transistor included in each of the memory cells connected to the word line.

* * * * *